United States Patent [19]
Okayama et al.

[11] Patent Number: 5,189,714
[45] Date of Patent: Feb. 23, 1993

[54] OPTICAL WAVELENGTH FILTER DEVICE

[75] Inventors: Hideaki Okayama; Takashi Ushikubo, both of Tokyo, Japan

[73] Assignee: Oki Electric Industry Co., Ltd., Tokyo, Japan

[21] Appl. No.: 767,110

[22] Filed: Sep. 27, 1991

[30] Foreign Application Priority Data

Sep. 28, 1990 [JP] Japan .................................. 2-262161

[51] Int. Cl.⁵ ......................... G02B 6/10; G02B 6/38; H01S 3/082
[52] U.S. Cl. ...................................................... 385/27
[58] Field of Search ........................................... 385/27

[56] References Cited

U.S. PATENT DOCUMENTS

| | | | |
|---|---|---|---|
| 4,358,851 | 11/1982 | Scifres et al. | 372/97 |
| 4,861,136 | 8/1989 | Stone et al. | 385/27 X |
| 4,878,731 | 11/1989 | Caron et al. | 385/27 X |
| 5,031,989 | 7/1991 | Morishita et al. | 385/27 |
| 5,073,004 | 12/1991 | Clayton et al. | 385/27 |

FOREIGN PATENT DOCUMENTS

| | | |
|---|---|---|
| 0386797 | 9/1990 | European Pat. Off. |
| 1-186918 | 7/1989 | Japan . |
| 2-044303 | 2/1990 | Japan . |
| 1290459 | 2/1987 | U.S.S.R. |

OTHER PUBLICATIONS

"Wavelength-Tunable Optical Filters: Applications and Technologies," by Haim Kobrinski and Kwok-Wai Cheung, IEEE Communications Magazine, Oct. 1989, pp. 53-63.

*Primary Examiner*—Akm E. Ullah
*Attorney, Agent, or Firm*—Edward D. Manzo; John J. King

[57] ABSTRACT

An optical wavelength filter device capable of increasing the number of channels by narrowing a line width and widening a tuning width and comprising a first optical wavelength filter of a mode conversion type and a second optical wavelength filter of an interferometer type optically coupled with the first optical wavelength filter.

9 Claims, 3 Drawing Sheets

OPTICAL WAVELENGTH FILTER DEVICE

FIELD OF THE INVENTION

The present invention relates to an optical wavelength filter device capable of variably controlling a transmission wavelength.

BACKGROUND OF THE INVENTION

There are existing conventional filter for separating an optical signal having a specific wavelength $\lambda_o$ among optical signals having multiplexed wavelengths. For example, the literature (1) entitled "IEEE Communication Magazine", Pages P. 53 to P. 63, published Oct., 1989 discloses filters is divided into four classes, namely: (a) Fabry-Perot type; (b) Mach-Zehnder type; (c) mode conversion type; and (d) Bragg reflection type. Assuming that the transmission wavelength $\lambda_o$ is varied from a designed standard wavelength $\lambda$ to $\lambda+\Delta\lambda$, the filters of the type of a, b and d have the wavelength variation amount $\Delta\lambda$ expressed in formula (1) while the filter of the type c has the wavelength variation amount $\Delta\lambda$ expressed in formula (2).

$$\frac{\Delta\lambda}{\lambda} = \frac{\Delta n}{n} \quad (1)$$

$$\frac{\Delta\lambda}{\lambda} = \frac{\Delta n}{\delta n} \quad (2)$$

where $\Delta n$: amount of refractive index which can be electrically varied by a waveguide of the filter
n: refractive index of the waveguide of the filter
$\delta n$: refractive index difference between modes e.g. refractive index difference between TM mode and TE mode.

The wavelength $\lambda$ is generally determined by shapes, dimensions, materials and the like of the components of the filter and forms a constant. However, since a filter utilizing an acousto-optical effect among the c-type filters can electrically vary the cycle of gratings for converting the modes of the light, the designed standard wavelength can be variably controlled. Accordingly, the variable range (i.e. tuning width of the transmission wavelength$\lambda_o$) is the widest in the c-type filter although there is an upper limit in the refractive index $\Delta n$ which is electrically variably controllable.

The a-type to d-type filters set forth above can transmit the light having the line width, i.e. transmission bandwidth extending $\Delta\lambda_{FWHM}$ with the transmission wavelength as a center thereof. The line width $\Delta\lambda_{FWHM}$ in the a-type filter to the d-type filter is expressed in the following formulas.

$$\frac{\Delta\lambda_{FWHM}}{\lambda} = \frac{\lambda}{2\cdot L \cdot n} \cdot \frac{(1-R)}{\pi\sqrt{R}} \quad (3a)$$

$$\frac{\Delta\lambda_{FWHM}}{\lambda} = \frac{\lambda}{L\cdot nV} \quad (3b)$$

$$\frac{\Delta\lambda_{FWHM}}{\lambda} = \frac{\lambda}{L\cdot \delta n} \quad (3c)$$

$$\frac{\Delta\lambda_{FWHM}}{\lambda} = \frac{\lambda}{2\cdot L \cdot n} \quad (3d)$$

where L: length of the filter (length of electrode)
R: reflectance at the plane of incidence and emittance Since an inequality $\delta n << n$ is normally established, the line width $\Delta\lambda_{FWHM}$ of the a-type, b-type and d-type filters is very narrow while the line width $\Delta\lambda_{FWHM}$ of the c-type filter is very wide as easily understood from the formulas (3a) to (3d).

The number of channels in the a-type filter is expressed as follows.

$$\frac{2\cdot L \cdot \Delta n_{max}}{\lambda} \cdot \frac{\pi\sqrt{R}}{(1-R)}$$

However, since it is subjected to the limitation of an FSR (Free Spectrum Range), the number of channels as a single element is expressed as follows.

$$\frac{\pi\sqrt{R}}{(1-R)}$$

The number of channels in the b-type and c-type filters is expressed as follows.

$$\frac{L\cdot \Delta n_{max}}{\lambda}$$

The number of channels in the d-type filter is expressed as follows.

$$\frac{2\cdot L \cdot \Delta n_{max}}{\lambda},$$

where $\Delta\lambda_{max}$ is the maximum $\Delta n$ in the variable

Accordingly, assuming that $\Delta n_{max} \simeq 0.01$ is established, the a-type filter has 10 channels by the limitation of the FSR provided that R 0.9 (capable of having 80 channels potentially if disregarding the limitation of the FSR). The b-type filter has 80 channels provided that $L \simeq 1$ cm while the c-type filter has 8 channels provided that $L \simeq 1$ mm and the d-type filter has 8 channels provided that $L = 500$ $\mu$m.

As mentioned above, the line width $\Delta\lambda_{FWHM}$ can be narrowed but the tuning width (variable range of transmission wavelength $\lambda_o$) can not be widened according to the conventional a-type, b-type and d-type filters. However, with the c-type filter the tuning width can be widened but the line width $\Delta\lambda_{FWHM}$ can not be narrowed.

Accordingly, in view of increasing the number of the channels (=tunning width/line width $\Delta\lambda_{FWHM}$), the number of channels can be increased by lengthening the length L of the device which results in narrowing the line width $\Delta\lambda_{FWHM}$ according to the a-type, b-type and d-type filters but it is difficult to use these filters if the line width $\Delta\lambda_{FWHM}$ is narrowed. On the contrary, according to the c-type filter, it is impossible to increase the number of channels unless the length L of the device is lengthened to the extreme extent, e.g., $L=1$ m.

SUMMARY OF THE INVENTION

It is an object of the present invention to solve the problems of the conventional filter and to provide an optical wavelength filter device capable of narrowing practically the line width $\Delta\lambda_{FWHM}$ and widening the tuning width.

To achieve the above object, the optical wavelength filter device for separating an optical signal having a specific wavelength among the optical signals having a multiplexed wavelength comprises a first optical wavelength filter of a mode conversion type and a second wavelength filter of a interferometer type optically connected to the first optical wavelength filter.

With arrangement of the optical wavelength filter according to the present invention, the transmission wavelength is substantially one wavelength $\lambda_{01}$ since the first optical wavelength filter is the mode conversion type. The first optical wavelength filter transmits the light having the wavelength extending to the line width $\Delta\lambda_{MC1}$ with the transmission wavelength $\lambda_{01}$ as the center thereof.

Since the second wavelength filter is the interferometer type, the transmission wavelength comprises a plurality of wavelengths $\lambda_{020}, \lambda_{021}, \ldots$ which are arranged in a specific cycle. The second wavelength filter transmits the light having the wavelength extending to the line width $\Delta\lambda_{MC20}$ with the transmission wavelength $\lambda_{020}$ as the center thereof and the light having the wavelength extending to the line width $\Delta\lambda_{MC21}$ with transmission wavelength $\lambda_{021}$ as the center thereof. The line widths $\Delta\lambda_{MC20}, \Delta\lambda_{C21}, \ldots$, are all substantially equal to each other and expressed as $\Delta\lambda_{MC20} = \Delta\lambda_{C21} = \cdots = \Delta\lambda_{MC2}$. The line width $\Delta\lambda_{MC2}$ of the second optical wavelength filter is more narrow than the line width $\Delta\lambda_{MC1}$ of the first wavelength filter.

To separate the desired wavelength $\lambda_{OUT}$ among the light having the multiplexed wavelengths, it is necessary to control the transmission wavelengths of the first and second optical wavelength filters, so as to equalize the transmission wavelength $\lambda_{01}$ of the first optical wavelength filter to the desired wavelength $\lambda_{OUT}$ and further equalize one of the transmission wavelengths $\lambda_{020}, \lambda_{021}, \ldots$, to the desired wavelength $\lambda_{OUT}$. It is further necessary to apply the light having the multiplexed wavelengths to the first optical wavelength filter and then apply the transmission light of the first optical wavelength filter, alternatively to the second optical wavelength filter or vice versa, namely, to apply the light having the multiplexed wavelengths to the second optical wavelength filter and then apply the transmission light of the second optical wavelength filter to the first optical wavelength filter. As a result, the light output from the optical wavelength filter of the present invention becomes the light having the wavelength extending to the line width $\Delta\lambda_{MC2}$ with the desired wavelength $\lambda_{OUT}$ as the center thereof whereby the light having the desired wavelength $\lambda_{OUT}$ can be separated.

DESCRIPTION OF THE PREFERRED EMBODIMENTS

Figure 1:
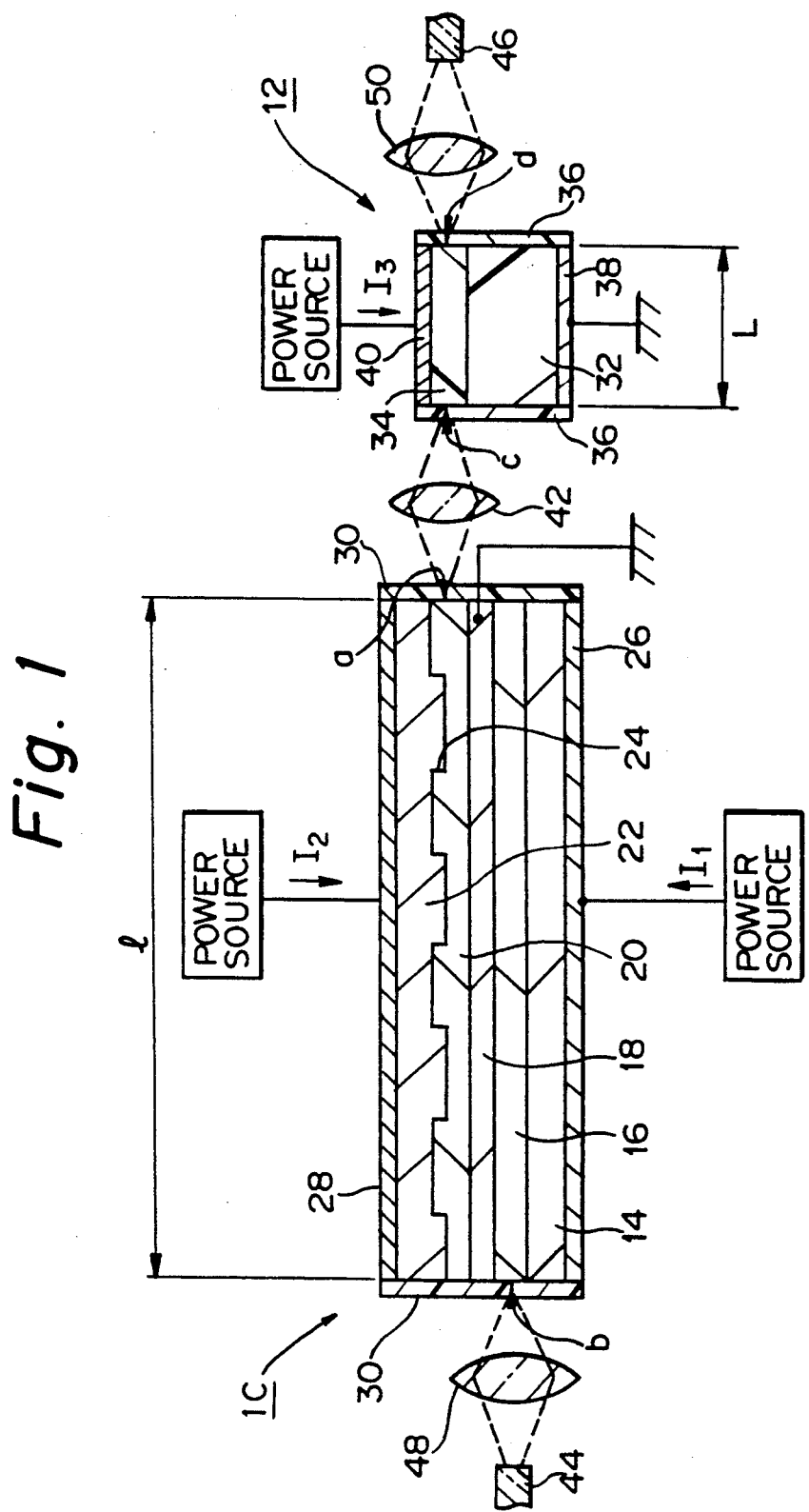
FIG. 1 is a cross sectional view of an optical filter device according to a first embodiment of the present invention.

FIG. 1 is a cross sectional view schematically showing an arrangement of the optical wavelength filter device according to the first embodiment of the present invention in which the cross section is taken along waveguides.

The optical wavelength filter device comprises, as illustrated in FIG. 1, a first optical wavelength filter 10 of a mode conversion type and a second optical wavelength filter 12 of an interferometer type which is connected to the first filter 10.

The first optical wavelength filter 10 comprises a first waveguide 16, a gap layer 18, a second waveguide 20 and a clad layer 22 respectively successively layered on a substrate 14 in this order and gratings 24 respectively provided on the second waveguide 20.

The first optical waveguide filter 10 has the gap layer 18 connected to a ground potential and further comprises a first electrode 26 disposed on a lower surface of the substrate 14 and a second electrode 28 disposed on the upper clad layer 22, a first pn junction for injecting a carrier into the first waveguide 16 and a second pn junction for injecting a current or a carrier into the second waveguide 20.

The material of the element of the first optical wavelength 10, the conductivity type, and the positions where the electrodes are disposed or the first and second junctions are disposed in the first optical wavelength filter 10 are not limited to those as set forth above. For example, the substrate 14 is formed of p-InP, the first waveguide 16 is formed of n⁻-InGaAsp, the gap layer 18 is formed of n-InP, the second waveguide 20 is formed of n⁻-InGaAsP and the upper clad layer 22 is formed of p-InP while the first pn junction is formed on the boundary between the first waveguide 16 and the substrate 14 and the second pn junction is formed on the boundary between the second waveguide 20 and the upper clad layer 22.

Alternatively, the substrate 14 is formed of p-GaAs, the first waveguide 16 is formed of n⁻-AlGaAs, the gap layer 18 if formed of n-GaAs, the second waveguide 20 is formed of n⁻-AlGaAs and the upper clad layer 22 is formed of p-GaAs while the first pn junction is formed on the boundary between the first waveguide 16 and the substrate 14 and the second pn junction is formed on the boundary between the second waveguide 20 and the upper clad layer 22.

The first waveguide 16 and the second waveguide 20 form a waveguide system which ejects the light having the wavelength among those incident to the first waveguide 16 which does not satisfy the formula (4), described later, from the first waveguide 16 and ejects the light having the wavelength 01 among those incident to the first waveguide 16 which satisfies the formula (4) from the second waveguide 20. The waveguide system excites an even mode light (or odd mode light) in the first waveguide 16 while exciting the odd mode light (or even mode light) in the second waveguide 20. This waveguide system does not subject the light having the wavelength among those incident to the first waveguide 16 which does not satisfy the formula (4) to the mode conversion but subjects the light among those incident to the first waveguide 16 which satisfy the formula (4) to the mode conversion. A nonreflective coating or reflection prevention film 30 is provided on an end facet to which the light to the first waveguide 16 is incident and an end facet from which the light from the second waveguide 20 ejects.

The first waveguide 16 and the second waveguide 20 are formed so as to generate a mode refractive index difference $\delta n$ between the waveguides 16 and 20 at the state where no voltage is applied to the electrodes 26 and 28.

The mode refractive index difference means the difference between the refractive indexes which the light of the mode excited in the first waveguide 16 sees in the first waveguide 16 and the light of the mode excited in the second waveguide 20 sees in the second weaveguide 20. The refractive index difference δn is generated by differentiation the component ratio of the first waveguide 16 and the second waveguide 20 or differentiating the layer thickness of both the first and second waveguides 16 and 20. The gratings 24 are provided for forming a refractive index profile variable periodically in the optical waveguide direction on the second waveguide 20. According to the first embodiment, the gratings 24 are directly formed on the second waveguide 20. Provided that the cycle of the gratings 24 in the optical direction is expressed as, the optical wavelength $\lambda_{01}$ energized by the second waveguide 20 is given in the following formula (4).

$$\frac{2 \cdot \pi}{\Lambda} = \frac{2 \cdot \pi}{\lambda_{01}} \cdot \delta n \qquad (4)$$

The cycle 01 is a constant determined when designed and λn is the amount which is variable by arbitrarily preferably controlling the amount of the carrier to be injected into the first waveguide 16 and the second waveguide 20.

When the amount of current $I_1$ which flows between the first electrode 26 and the ground and the amount of current $I_2$ which flows between the second electrode 28 and the ground are varied arbitrarily, preferably by applying the voltages to the first electrode 26 and the second electrode 28, the amount of the carrier to be injected into the first waveguide 16 and the second waveguide 20 is varied while the refractive indexes of the first waveguide 16 and the second waveguide 20 are respectively varied in response to the amount of the carrier to be injected whereby the δn is varied. Accordingly, the wavelength $\lambda_{01}$ can be varied by arbitrarily preferably regulating the voltage to be applied to the first electrode 26 and the second electrode 28.

It is possible to generate an optical stimulated emission in both the first and second waveguides 16 and 20 by injecting the carrier into the first and second waveguides 16 and 20, thereby amplifying the light.

The second optical wavelength filter 12 will be described more in detail.

The second optical wavelength filter 12 according to the first embodiment is equipped with a Fabry-Perrot interferometer. A semiconductor laser structure equipped with a Fabry-Perot resonator is employed as such a Fabry-Perot interferometer. According to the first embodiment, since the known arbitrarily preferable structure is employed as the semiconductor laser structure, the explanation of the structure thereof is simplified.

The second optical wavelength filter 12 comprises a substrate 32 and a laser layer 34 disposed on the substrate 32. The laser layer 34 is the portion for energizing and oscillating the laser light on the semiconductor laser and equipped with the Fabry Perrot resonator. The Fabry-Perrot resonator comprises an active layer (waveguide) and optical reflective portions provided respectively on both end portions of the waveguide and functions as the interferometer. An optical reflective film 36 is provided on the light incident end facet and the light emissive end facet of the interferometer as the light reflective portion and electrodes 38 and 40 are provided on the under surface of the substrate 32 and on the laser layer 34.

When a current $I_3$ is forced to flow between the electrodes 38 and 40 to thereby vary the concentration of the carrier in the waveguide of the interferometer, a refractive index n of the waveguide is varied.

The wavelength (the transmission wavelength $\lambda_{02m}$ of the second optical wavelength filter, where m=0, 1, 2, —) which reflects from the interferometer is expressed in the following formula (5).

$$\frac{2 \cdot \pi}{\lambda_{02m}} \cdot 2 \cdot L \cdot n = 2 \cdot \pi \cdot m \qquad (5)$$

where L represents the length of the interferometer (length of resonator).

As evident from the formula (5), the transmission wevelength $\lambda_{02m}$ of the second optical wavelength filter 12 can be controlled variably by regulating the current $I_3$ arbitrarily preferably.

According to the first embodiment, when the first optical wavelength filter 10 and the second optical wavelength filter 12 are optically coupled with each other, the end facet a of the first optical waveguide 10 at the one side of the first optical wavelength filter 10 is optically connected with the end facet c of the interferometer at the one side of the second optical wavelength filter 12 by way of a coupling lense 42. In this case, the first waveguide 16 allows an end facet b thereof at the other side of the first optical waveguide filter 10 to optically couple with an input side external transmission line 44 and the interferometer allows an end facet d thereof at the other side of the second optical wavelength filter 12 to couple with an external line 46. The optical wavelength filter device according to the first embodiment receives an optical signal having multiplexed wavelengths from the external transmission line 44 and separates the desired optical signal from the optical signals having the multiplexed wavelengths and outputs the thus separated optical signal to the external transmission line 46 at the output side thereof. In the first embodiment as illustrated in FIG. 1, the external transmission line 44 at the input side is coupled with the end facet b by way of a coupling lense 48 while the external transmission line 46 at the output side is coupled with the end facet d by way of a coupling lense 50.

The method of coupling of the first and second optical waveguide filters 10 and 12 is not limited to the one set forth above. For example, the end facet b is optically coupled with the end facet c while the end facet d is optically coupled with the input side outer transmission line 44 and the end facet a is optically coupled with the output side external transmission line 46.

Figure 2A:
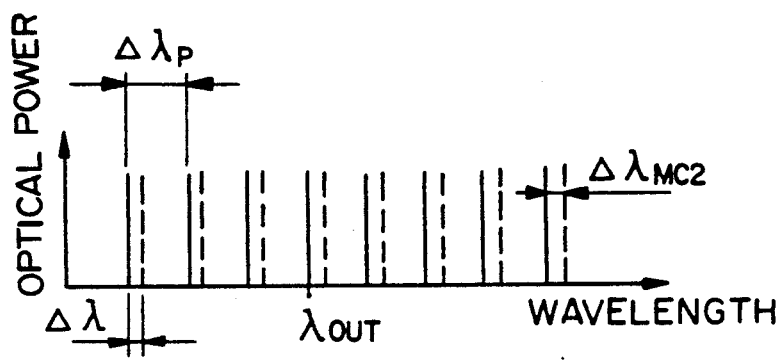
FIGS. 2(A) to 2(C) are graphs showing respectively optical transmission property according to the first embodiment.
Figure 2B:
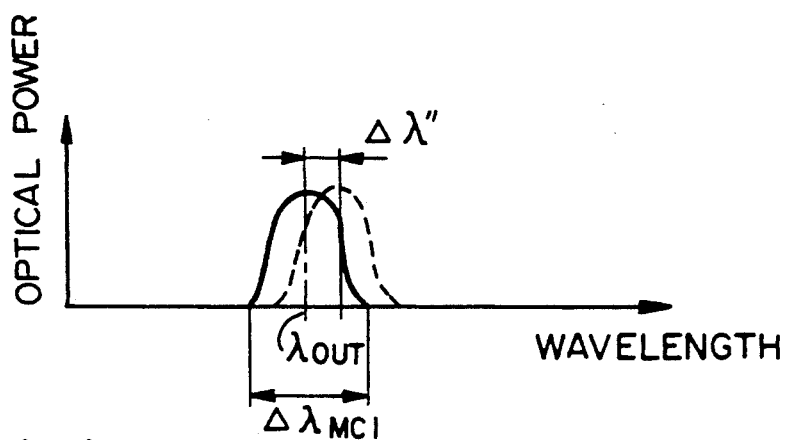
Figure 2C:
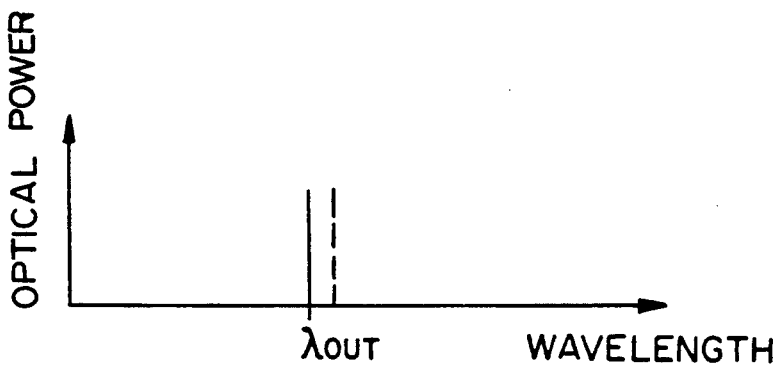

FIGS. 2(A) to 2(C) are graphs showing an optical transmission property in the optical wavelength filter according to the first embodiment.

In FIG. 2(A), the second optical wavelength filter is employed alone in which the vertical axis represents the optical power output from the second optical wavelength filter and the lateral axis represents the wavelength. In FIG. 2(B), the first optical wavelength filter is employed alone in which the vertical axis represents the the optical power output from the first optical wavelength filter and the lateral axis represents the wavelength. In FIG. 2(C) showing the optical transmission property, a coupling of the first optical wavelength filter with the second optical wavelength filters is employed in which the vertical axis represents the the optical power output from the second optical wavelength filter and the lateral axis represents the wavelength.

When the second wavelength filter 12 alone is employed as illustrated in solid line in FIG. 2(A), the transmission wavelength $\lambda_{02m}$ of the second optical wavelength filter 12 comprises a plurality of wavelengths arranged in a specific cycle (refer to formula 5). The pitch of the transmission wavelength $\Delta\lambda_p$ is expressed as follows.

$$\frac{\Delta\lambda_p}{\lambda_{02m}} = \frac{\lambda_{02m}}{2 \cdot L \cdot n}$$

When the refractive index of the waveguide of the interferometer of the second optical wavelength filter 12 is varied for the amount of $\Delta n$, the transmission wavelength $\lambda_{02m}$ is deviated for the amount of $\Delta\lambda$ as illustrated in dotted lines in FIG. 2(A).

The deviation amount of $\Delta\lambda$ is expressed as follows.

$$\frac{\Delta\lambda}{\lambda_{02m}} = \frac{\Delta n}{n}$$

If the second optical wavelength filter 12 satisfies the formula $$\text{formula } \frac{\Delta\lambda}{\lambda_{02m}} = \frac{\Delta\lambda_p}{\lambda_{02m}},$$

the amount $\Delta\eta$ expressed by the formula (6) is required.

$$\Delta n = \frac{\lambda_{02m}}{2 \cdot L} \quad (6)$$

On the other hand, the transmission wavelength $\lambda_{01}$ of the first optical wavelength filter becomes substantially one as illustrated in solid line in FIG. 2(B) (refer to FIG. 4). The line width $\Delta\lambda_{MC1}$ of the first optical wavelength filter 10 is expressed in the following formula.

$$\frac{\Delta\lambda_{MC1}}{\lambda_{01}} = \frac{\lambda_{01}}{l \cdot \delta n}$$

where l represents the length of the first waveguide 16 or the second waveguide 20 (refer to FIG. 1).

If the refractive index of the first waveguide 16 or the second waveguide is deviated for the amount of $\Delta n''$, the transmission wavelength $\lambda_{01}$ is deviated for the amount of $\Delta\lambda''$. The state where the transmission wavelength $\lambda_{01}$ is deviated for the amount of $\Delta\lambda''$ is illustrated in dotted lines in FIG. 2(B). The deviation amount $\Delta\lambda''$ is expressed in the following formular (7).

$$\frac{\Delta\lambda''}{\lambda_{01}} = \frac{\Delta n''}{\delta n} \quad (7)$$

As illustrated by a solid line in FIG. 2(C), it is necessary to establish the following formula in order to separate the light having a single transmission wavelength $\lambda_{OUT}$ with use of the first optical filter 10 and the second optical wavelength filter 12.

$$2 \cdot \frac{\Delta\lambda_p}{\lambda_{02m}} = \frac{\Delta\lambda_{MC1}}{\lambda_{01}}$$

Accordingly, the first optical wavelength filter 10 and the second optical wavelength filter 12 may be fabricated in order to satisfy the following formular (8) in a state where a driving voltage is not applied.

The upper limit values of the variation ratio $$\text{ratio } \frac{\Delta n}{n} \text{ and } \frac{\Delta n''}{n''}$$

(n'' are refractive index of the first waveguide 16 and the second waveguide 29) range substantially from $10^{-3}$ to $10^{-2}$. Under the condition of the upper limits set forth above, the number of the channels will be exemplarily discussed hereinafter.

Assuming that the deviation amount $\Delta\lambda''$ equals to 100 nm and $\lambda \approx 1$ μm, the deviation ratio $\Delta\lambda''/\lambda$ becomes substantially 0.1 from the formular (7) so that $\delta n/n''$ becomes substantially $10^{-2}$ to $10^{-1}$. From the formula (6), the length L may be substantially 200 to 20 μm and from the formula (8) the length l may be substantially 20 mm to 200 μm. The length l is preferable to be less than 1 mm in order to reduce the driving current or to expedite the operation speed.

Whereupon the number of the channels according to the first embodiment is expressed as follows.

$$\frac{\Delta\lambda''}{\Delta\lambda_{MC2}} = \frac{\Delta n''}{\delta n} \cdot \frac{2 \cdot L \cdot n \cdot R}{\lambda_{OUT} \cdot (1-R)}$$

$$= \Delta n'' \cdot \frac{2 \cdot l}{\lambda_{OUT}} \cdot \frac{\pi \sqrt{R}}{1-R}$$

Accordingly, it is possible to increase the number of channels as the length l is longer and the refractive R approaches to 1 while the formula $\Delta\lambda_{MC2}/\lambda_{OUT} \approx 2 \times 10^{-4}$ is established.

Assuming that the half value width of the transmission peak of the second optical wavelength filter 12 is $\Delta\lambda_{MC2}/\lambda_{OUT}$ and the refractive index R of the reflective film 36, i.e. $R \approx 0.9$, the number of channels of the first embodiment becomes substantially 140.

The number of channels is expressed as follows when the first optical wavelength 10 alone is employed.

$$\frac{\Delta\lambda''}{\Delta\lambda_{MC1}} = \frac{\Delta n'' \cdot l}{\lambda_{OUT}}$$

The number of channels is expressed as follows when the second optical wavelength 20 alone employed.

$$\frac{\Delta\lambda}{\Delta\lambda_{MC2}} = \Delta n \cdot \frac{2 \cdot L}{\lambda_{OUT}} \cdot \frac{\pi \sqrt{R}}{1-R}$$

Accordingly, the number of channels according to the first embodiment becomes $(2*\sqrt{\pi R})/(1-R)$ times as large as the number of channels when the first optical wavelength filter 10 alone is employed and 1/L $(=n/\delta n)$ times as large as the number of channels when the second optical wavelength filter 20 alone is employed, which results in about 10 times as large as the number of channels when the first optical wavelength filter 10 alone or the second optical wavelength filter 20 alone is employed.

According to the first embodiment, it is possible to fabricate the optical wavelength filter having the 140 channels with the lengths l and L being less than 1 mm.

Figure 3:
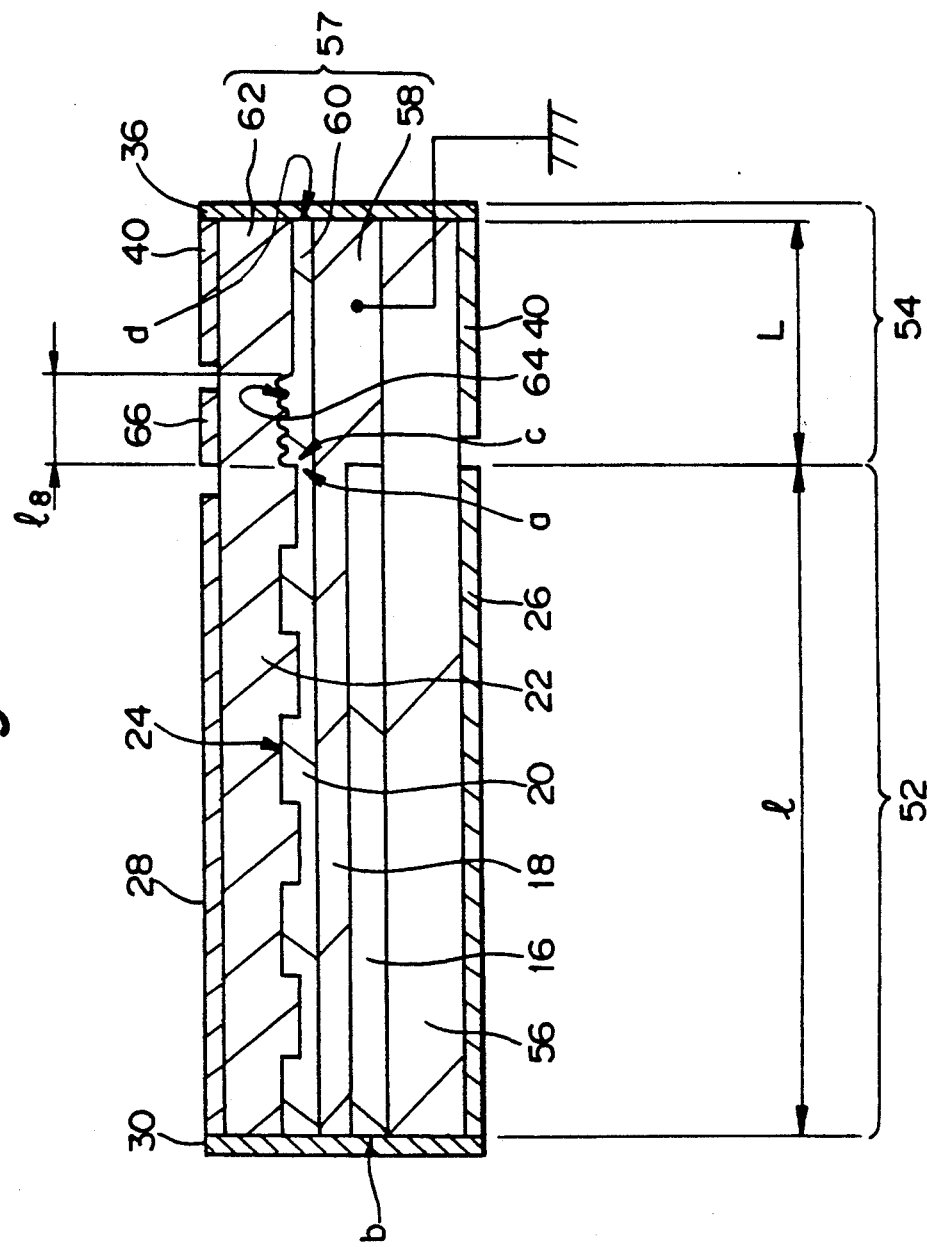
FIG. 3 is a cross sectional view of an optical wavelength filter device according to a second embodiment of the present invention.

FIG. 3 is a schematic cross sectional view of an optical wavelength filter device according to the second embodiment of the present invention. The components corresponding to those of the first embodiments are denoted at same numerals and the detailed explanation thereof is omitted.

The optical wavelength filter according to the second embodiment comprises a first optical wavelength filter 52 and a second optical wavelength filter 54 respectively integrated on a common substrate 56.

The first filter 52 comprises the first waveguide 16, the gap layer 18, the second waveguide 20 and the upper clad layer 22 which are respectively successively layered in this order on the common substrate 56 and gratings 24 are provided on the second waveguide 20.

The first optical wavelength filter 52 has a first electrode on the lower surface of the common substrate 56 and a second electrode on the upper clad layer 22 both in the region to form the first optical wavelenght filter 52, the first pn junction at the boundary between the common substrate 56 and the first waveguide 16 and and the second pn junction at the boundary between the second waveguide 20 and the upper clad layer 22.

The second optical wavelength filter 54 comprises a laser layer 57 provided on the substrate 56 in the region for forming the second wavelength filter 54. The laser layer 57 comprises a lower clad layer 58, a waveguide 60 and an upper clad 62 which are respectively successively layered in this order on the common substrate 56 in the region for forming the second optical wavelength 35 filter 54 and a Bragg reflector 64 formed on the end facet c of the waveguide 60. An electrode 40 is provided on the lower surface of the common substrate 56 in the region for forming the second optical wavelength filter 54 and an electrode 66 is provided on the upper clad layer 62 in the region corresponding to the Bragg reflector 64 in the region for forming the second optical wavelength filter 54. The electrode 40 is provided on the upper clad layer 62 in the remaining region.

According to the second embodiment, a first single layer composed of the upper clad layers 22 and 62 is formed of common materials, a second single layer composed of the second waveguide 20 and the waveguide 60 is composed of the same materials and a third single layer composed of the gap layer 18 and the lower clad layer 58 is formed of common materials.

The non-reflective coating 30 is provided on the end facet b of the first optical waveguide 16. The nonreflective coating 30 is provided on the end facet of the second waveguide 20 according to the first embodiment, but it is not provided at the end facet a according to the second embodiment. Although the reflective film 36 is provided on the end facet d of the waveguide 60 according to the first embodiment, a Bragg reflector 64 is provided in the second embodiment as the optical reflective portion of the interferometer instead of the reflective film 36. Although the reflective film 36 is provided at the location corresponding to the first optical waveguide 16 in FIG. 2, it is preferable not to provide the reflective film 36 at the location corresponding to the first waveguide 16 for preventing the light emitted from the first waveguide 16 from reflecting by the reflective film 36 to return to the first waveguide 16.

The carrier, to be injected into the waveguide 60 provided with the Bragg reflector 64, is controlled by way of the electrode 66 for allowing the wavelength of the light, which is effectively reflected by the Bragg reflector 64, to conform with the wavelength $\lambda_{OUT}$.

The range $\Delta\lambda_B$ of the wavelength at which the reflectance of the Bragg reflector 64 is large (the wavelength at which the Brag reflector 64 reflects the light) is expressed as follows.

$$\frac{\Delta\lambda_B}{\lambda} = \frac{\lambda}{2 \cdot l_B \cdot n}$$

where $l_B$ is the length of the Bragg reflector 64 in the direction of the waveguide 60.

Accordingly, it is preferable that the length $l_B$ is short in order to widen the variable range of the transmission wavelength $\lambda_{OUT}$ (tuning width) as far as possible assuming that the formula is $\Delta\lambda''/\lambda \simeq \Delta\lambda_B/\lambda$ is established.

To satisfy the formula $\Delta\lambda''/\lambda \simeq \Delta\lambda_B/\lambda$, the length $l_B$ is expressed as $l_B = \{\lambda^2/(2\cdot n)\}/\Delta\lambda''$. Accordingly, it is necessary that the length $l_B$ is expressed $l_B \simeq 20 \sim 2$ μm in order to satisfy the formula $\Delta\lambda''/\lambda \simeq 0.01 \sim 0.1$. However, when the length $l_B$ is shortened, the gratings of the reflectors 64 should be deepened in order to obtain the sufficient reflectance practicably, which involve the difficulty of the fabrication thereof.

In order to widen the tuning width as far as possible without shortening the length $l_B$, it is preferable to gradually narrow or widen the pitch of the gratings of the Bragg reflector 64 in the direction along the waveguide 60, thereby forming the charped gratings.

The optical wavelength filter device according to the present invention is not limited to the first and second embodiments set forth above but each component thereof can be varied in the structure, shape, dimensions, disposing position and material thereof and other conditions thereof can be arbitrarily preferably varied.

For example, the first pn junction and the second pn junction in the first optical wavelength filter can be arbitrarily preferably positioned at the locations where the carrier can be injected into the first and second waveguides. Accordingly, the conductivity type of the component of the first optical wavelength filter can be arbitrarily preferably varied.

As evident from the explanations set forth above, the transmission wavelength is substantially the single wavelength $\lambda_{01}$ since the first optical wavelength filter is of the mode conversion type according to the present invention. The first optical wavelength filter transmits the light having the wavelengh ranging the line width $\Delta\lambda MC1$ with the transmission wavelength $\lambda_{01}$ as the center thereof.

Since the second optical wavelength filter is of the interferometer type, the transmission wavelength thereof is formed of a plurality of wavelengths $\lambda_{020}, \lambda_{021}$, . . . which are arranged in a specific cycle. The second optical wavelength filter transmits the light having the wavelengths ranging the line width $\Delta\lambda_{MC20}$ with the transmission wavelength $\lambda_{020}$ as the center thereof, the light having the wavelengths ranging the line width $\Delta\lambda_{021}$ with the transmission wavelength $\Delta\lambda_{MC21}$ as the center thereof, . . . .The line widths $\Delta\lambda_{MC20}, \Delta\lambda_{MC21},$ . . . are substantially the same and expressed as $\Delta\lambda_{MC20} = \Delta\lambda_{MC21} \ldots = \Delta\lambda_{MC2}$. The line width $\Delta\lambda_{MC2}$ of the second optical wavelength filter is more narrow than the line width $\Delta\lambda_{MC1}$ of the first optical wavelength filter.

Accordingly, if the transmission wavelength $\Delta\lambda_{01}$ of the first optical wavelength filter is equalized to the desired wavelength $\lambda_{OUT}$ and one of the transmission wavelenths $\lambda_{020}, \lambda_{021}, \ldots$ is equalized to the desired wavelength $\lambda_{OUT}$, the light finally supplied from the optical wavelength filter device of the present invention becomes the light having the wavelength ranging the line width $\Delta\lambda_{MC2}$ with the wavelength $\lambda_{OUT}$ as the center thereof.

Accordingly, it is possible to separate the optical signal having the desired wavelength $\lambda_{OUT}$ which is in the the narrow line width $\Delta\lambda_{MC2}$ being the feature of the second optical wavelength filter of the interferometer type.

Furthermore, if the transmission wavelength $\lambda_{02M}$ of the second optical wavelength filter is variably controlled within the cycle of the transmission wavelength $\lambda_{02M}$ and the transmission wavelength $\lambda_{01}$ of the first optical wavelength filter is allowed to conform to the transmission wavelength of the second otpical wavelength filter, the light having the desired wavelength $\lambda_{OUT}$ can be separated. Accordingly, the tuning width of the present device is widened since it is equivalent to the tuning width when the first optical wavelength filter is employed alone.

It is therefore possible to increase the number of having multiplexed wavelengths characterized in channels since the line width $\Delta\lambda_{MC2}$ can be narrowed and the tuning width can be widened according to the present invention.

What is claimed is:

1. An optical wavelength filter device for separating an optical signal having a specific wavelength among those having multiplexed wavelengths comprising:
   a first optical wavelength filter of a mode conversion type, said first optical wavelength filter having a wide turning width; and
   a second optical wavelength filter of an interferometer type optically coupled with the first optical wavelength filter, said second optical wavelength filter having a generally narrower bandpass width that of said first optical wavelength filter.

2. An optical wavelength filter device according to claim 1, wherein the second optical wavelength filter is of a Fabry-Perot interferometer type.

3. An optical wavelength filter device for separating an optical signal having a specific wavelength among those having multiplexed wavelengths comprising:
   a first optical wavelength filter of a mode conversion type, said first optical wavelength filter having a wide tuning width; and
   a second optical wavelength filter of an interferometer type, wherein said first optical wavelength filter and said second optical wavelength filter are integrated on a common substrate, said second optical wavelength filter having a generally narrower bandpass width than that of said first optical wavelength filter.

4. An optical wavelength filter device according to claim 3 wherein the second optical wavelength filter has a Bragg interferometer-type filter.

5. An optical wavelength filter device according to claim 3 wherein said first wavelength optical filter further comprises a first waveguide on said substrate, a gap layer positioned on said first waveguide, a second waveguide positioned on said gap layer, and an upper clad layer positioned on said second waveguide.

6. An optical wavelength filter device according to claim 5 further comprising a first electrode on said substrate and a second electrode on said upper clad layer.

7. An optical wavelength filter device according to claim 3 wherein said second optical wavelength filter further comprises a lower clad layer positioned on said substrate, a waveguide, and an upper clad layer positioned on said waveguide.

8. An optical wavelength filter device according to claim 7 wherein the waveguide includes a Bragg reflector formed on said waveguide.

9. An optical wavelength filter device according to claim 8 further comprising a first electrode on said substrate and a second electrode on said upper clad layer in the region corresponding to the Bragg reflector, and a third electrode adjacent to said second electrode on said upper clad layer.

* * * * *